(12) United States Patent
Miyake

(10) Patent No.: US 9,901,017 B2
(45) Date of Patent: Feb. 20, 2018

(54) EMI SHIELDING MATERIAL HAVING IMPROVED DELAMINATION BEHAVIOR

(75) Inventor: Hiroshi Miyake, Mashiko-machi (JP)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 980 days.

(21) Appl. No.: 14/119,107

(22) PCT Filed: May 24, 2012

(86) PCT No.: PCT/IB2012/052623
§ 371 (c)(1),
(2), (4) Date: Dec. 18, 2013

(87) PCT Pub. No.: WO2012/160540
PCT Pub. Date: Nov. 29, 2012

(65) Prior Publication Data
US 2014/0097016 A1   Apr. 10, 2014

Related U.S. Application Data

(60) Provisional application No. 61/489,483, filed on May 24, 2011.

(51) Int. Cl.
| | |
|---|---|
| C08L 83/10 | (2006.01) |
| C08K 7/06 | (2006.01) |
| H05K 9/00 | (2006.01) |
| C08L 69/00 | (2006.01) |
| B32B 27/28 | (2006.01) |

(52) U.S. Cl.
CPC ............ *H05K 9/0081* (2013.01); *C08K 7/06* (2013.01); *C08L 69/00* (2013.01); *C08L 83/10* (2013.01); *B32B 27/28* (2013.01)

(58) Field of Classification Search
CPC ....... H05K 9/0081; C08L 69/00; C08L 83/10; C08K 7/02; C08K 7/04; C08K 7/06; C08K 2003/085; C08K 2003/0856; C08K 2003/0862; C08K 2003/0881; C08K 2003/0812
USPC ...................................................... 524/440
See application file for complete search history.

(56) References Cited

U.S. PATENT DOCUMENTS

| | | |
|---|---|---|
| 4,983,456 A | 1/1991 | Iwaskow et al. |
| 5,366,664 A | 11/1994 | Varadan et al. |
| 5,380,795 A | 1/1995 | Gosens et al. |
| 6,399,737 B1 | 6/2002 | Elkovitch |
| 6,613,820 B2 | 9/2003 | Fujiguchi et al. |
| 7,498,388 B2 | 3/2009 | Davis et al. |
| 7,695,815 B2 | 4/2010 | Agarwal et al. |
| 7,723,428 B2 | 5/2010 | DeRudder et al. |
| 7,858,680 B2 | 12/2010 | Sawant et al. |
| 8,324,318 B2 | 12/2012 | DeRudder |
| 8,404,338 B2 * | 3/2013 | Hein .................. C08L 69/00 252/62.56 |
| 2007/0105994 A1 * | 5/2007 | Li .................. C08L 69/00 524/115 |
| 2008/0033083 A1 * | 2/2008 | Li .................. C08F 279/02 524/115 |
| 2013/0309474 A1 * | 11/2013 | Peek .................. C08L 69/005 428/220 |
| 2014/0093712 A1 * | 4/2014 | Tong .................. C08L 69/00 428/220 |

FOREIGN PATENT DOCUMENTS

| | | |
|---|---|---|
| CA | 1245390 A | 11/1988 |
| EP | 0360112 A2 | 3/1990 |
| JP | 2010083983 A | 4/2010 |
| WO | 2011014778 A1 | 2/2011 |

OTHER PUBLICATIONS

Written Opinion of the International Searching Authority: International Apllication No. PCT/IB2012/052623; International Filing Date: May 24, 2012; 5 pages.
International Search Report; International Application No. PCT/IB2012/052623; International Filing Date: May 24, 2012; dated Aug. 6, 2012, 3 pages.

* cited by examiner

*Primary Examiner* — Marc Zimmer
(74) *Attorney, Agent, or Firm* — Cantor Colburn LLP

(57) ABSTRACT

Disclosed herein are thermoplastic compositions that provide electromagnetic/radio frequency interference (EMI/RFI) shielding characteristics to a molded article. The compositions offer improved delamination behavior. The compositions include a polycarbonate resin, a polysiloxane block co-polycarbonate, a conductive filler capable of providing EMI shielding characteristics and optionally other pigments and/or processing additives. The compositions can be used in a variety of applications such as personal computers, notebook and portable computers, cameras, or other electronic devices.

20 Claims, 1 Drawing Sheet

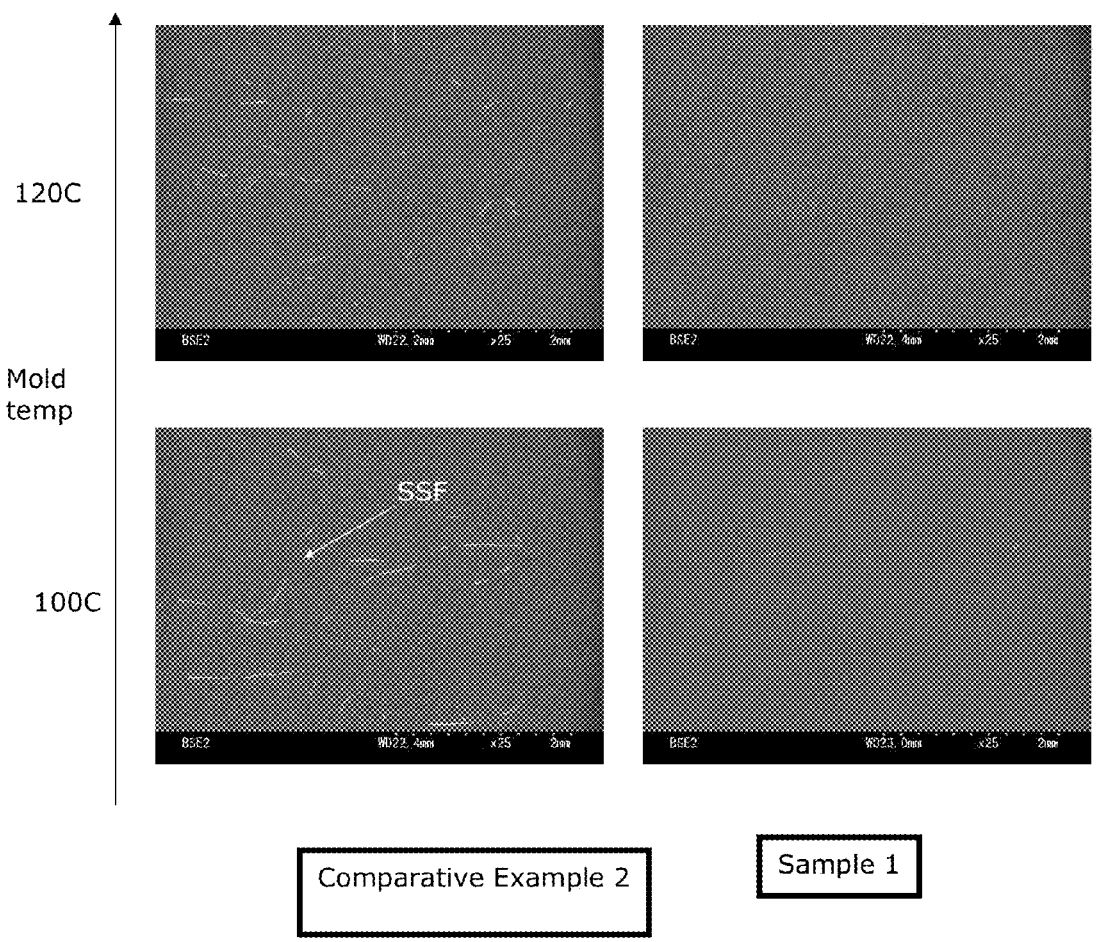

EMI SHIELDING MATERIAL HAVING IMPROVED DELAMINATION BEHAVIOR

CROSS REFERENCE TO RELATED APPLICATIONS

The present application is a U.S. national stage of application No. PCT/IB2012/052623, filed on May 25, 2012, which claims priority to U.S. Provisional Application No. 61/489,483 which was filed May 24, 2011, the contents of which in their entirety are herein incorporated by reference.

FIELD OF THE INVENTION

The present invention relates to thermoplastic compositions, and in particular to polycarbonate-based compositions capable of being used as an EMI shielding material. The present invention also relates to methods of manufacturing these compositions and articles that include these compositions.

BACKGROUND OF THE INVENTION

Electronic devices require protection from electromagnetic interferences in order to function properly. As a result, these devices are often made of materials exhibiting a high electromagnetic/radio frequency interference (EMI/RFI) shielding effectiveness (SE). Introduction of conductive materials to thermoplastic resins increases the electromagnetic shielding effectiveness of the resulting thermoplastic compositions. Unfortunately, to obtain a high level of shielding effectiveness, it is often necessary to use higher amounts of conductive filler in the composition. The result is that these fibers often end up on the surface of a molded part. As such, for parts that are painted or otherwise coated, delamination of the paint or coating layer often occurs due to lack of adhesion between the coating and the surface of the part resulting from the presence of conductive fillers on the surface of the part. If lower loadings of conductive fillers are used to help minimize this effect, the result is a composition that does not provide adequate shielding.

Accordingly, it would be beneficial to provide an EMI shielding material having improved delamination behavior. It would also be beneficial to provide an EMI shielding material that is capable of being painted or coated to permit use in a wider array of applications. It would also be beneficial to provide a thermoplastic composition that is capable of being used in EMI shielding applications.

BRIEF SUMMARY OF THE INVENTION

The present invention provides an electromagnetic/radio frequency interference (EMI/RFI) shielding material having improved delamination behavior. The compositions of the present invention include a polycarbonate resin, a polysiloxane block co-polycarbonate, a conductive filler capable of providing EMI shielding characteristics and optionally other pigments and/or processing additives. The compositions can be used in a variety of applications such as personal computers, notebook and portable computers, cameras, or other electronic devices.

Accordingly, in one aspect, the present invention provides a thermoplastic composition including from 1 to 30% by weight of polycarbonate, from 30 to 90% by weight of a polysiloxane block co-polycarbonate wherein the polysiloxane block co-polycarbonate has a polysiloxane block content of 10% by weight or less, from 1 to 30% by weight of an electromagnetic shielding agent, and from 0 to 20% by weight of at least one additive selected from a pigment, a processing additive or a combination including at least one of the foregoing additives; wherein the composition after molding has a shielding effectiveness of at least about 10 decibels measured according to ASTM D4935 and further wherein the composition after molding and painted or coated has improved delamination behavior.

In another aspect, the present invention provides a method of forming a thermoplastic composition including the step of blending in an extruder from 1 to 30% by weight of polycarbonate, from 30 to 90% by weight of a polysiloxane block co-polycarbonate wherein the polysiloxane block co-polycarbonate has a polysiloxane block content of 10% by weight or less, from 1 to 30% by weight of an electromagnetic shielding agent, and from 0 to 20% by weight of at least one additive selected from a pigment, a processing additive or a combination including at least one of the foregoing additives; wherein the composition after molding has a shielding effectiveness of at least about 10 decibels measured according to ASTM D4935 and further wherein the composition after molding and painted or coated has improved delamination behavior.

In yet another aspect, the present invention provides an article of manufacture that includes a composition including from 1 to 30% by weight of polycarbonate, from 30 to 90% by weight of a polysiloxane block co-polycarbonate wherein the polysiloxane block co-polycarbonate has a polysiloxane block content of 10% by weight or less, from 1 to 30% by weight of an electromagnetic shielding agent, and from 0 to 20% by weight of at least one additive selected from a pigment, a processing additive or a combination including at least one of the foregoing additives; wherein the composition after molding has a shielding effectiveness of at least about 10 decibels measured according to ASTM D4935 and further wherein the composition after molding and painted or coated has improved delamination behavior.

In still another aspect, the present invention provides a thermoplastic composition including from 5 to 20% by weight of polycarbonate, from 50 to 85% by weight of a polysiloxane block co-polycarbonate wherein the polysiloxane block co-polycarbonate has a polysiloxane block content of 8% by weight or less, from 5 to 20% by weight of an electromagnetic shielding agent, and from 1 to 10% by weight of at least one additive selected from a pigment, a processing additive or a combination including at least one of the foregoing additives; wherein the composition after molding has a shielding effectiveness of at least about 10 decibels measured according to ASTM D4935 and further wherein the composition after molding and painted or coated has improved delamination behavior.

In yet another aspect, the present invention provides a thermoplastic composition, including from 10 to 25% by weight of polycarbonate; from 60 to 75% by weight of a polysiloxane block co-polycarbonate wherein the polysiloxane block co-polycarbonate has a polysiloxane block content of 6% by weight or less; from 5 to 15% by weight of an electromagnetic shielding agent; and from 1 to 10% by weight of at least one additive selected from a pigment, a processing additive or a combination including at least one of the foregoing additives; wherein the composition after molding has a shielding effectiveness of at least about 10 decibels measured according to ASTM D4935; further wherein the composition after molding and painted or coated has improved delamination behavior.

In still another aspect, the present invention provides an article of manufacture including a molded article having from 10 to 25% by weight of polycarbonate; from 60 to 75% by weight of a polysiloxane block co-polycarbonate wherein the polysiloxane block co-polycarbonate has a polysiloxane block content of 6% by weight or less; from 5 to 15% by weight of an electromagnetic shielding agent; and from 0.11 to 10% by weight of at least one additive selected from a pigment, a processing additive or a combination including at least one of the foregoing additives; wherein the molded article further comprises a single coating layer and wherein the molded article has an EMI shielding effectiveness of at least 10 decibels measured according to ASTM D4935.

BRIEF DESCRIPTION OF THE DRAWINGS

FIG. 1 shows photographs of the surface of a molded article made from a prior art composition and a composition made according to the concepts of the present invention.

DETAILED DESCRIPTION OF THE INVENTION

The present invention is more particularly described in the following description and examples that are intended to be illustrative only since numerous modifications and variations therein will be apparent to those skilled in the art. As used in the specification and in the claims, the term "comprising" may include the embodiments "consisting of" and "consisting essentially of." All ranges disclosed herein are inclusive of the endpoints and are independently combinable. The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value.

The present invention is directed to an electromagnetic/radio frequency interference (EMI/RFI) shielding material having improved delamination behavior, as well as methods of making these compositions and articles made therefrom. The compositions of the present invention include a polycarbonate resin, a polysiloxane block co-polycarbonate, a conductive filler capable of providing EMI shielding characteristics and optionally other pigments and/or processing additives. The compositions can be used in a variety of applications such as personal computers, notebook and portable computers, cameras, or other electronic devices.

The compositions of the present invention solve the delamination problems associated with prior art compositions. As described above, delamination occurs when the molded article is painted or otherwise coated. The paint or coating layer normally adheres to the surface of the molded article. However, for compositions including a filler, such as the present compositions use of an electromagnetic shielding agent, the presence of the filler on the surface of the molded part results interferes with the ability of the paint or coating layer to adhere to the surface in those locations. This can result in peeling of the paint or coating layer, especially if the molded article is scratched. However, by minimizing the amount of filler located on the surface of the molded article, a better adhesion between the paint or coating layer can be achieved.

The compositions of the present invention achieve this solution through the use of a polysiloxane block co-polycarbonate having a polysiloxane block content of 10% by weight or less. By utilizing polysiloxane block co-polycarbonates that have a lower polysiloxane block content, the compositions of the present invention unexpectedly provide improved delamination behavior as compared to prior art compositions utilizing a polysiloxane block co-polycarbonate having higher amounts of polysiloxane block content even though the amount of polysiloxane block content in the final composition is approximately equal. This was unexpected since it is not the amount of polysiloxane block content in the final composition that was the determining factor but rather the amount of polysiloxane block content in the polysiloxane block co-polycarbonate. Since the total amount of polysiloxane block content in the total composition can be in the approximate general range as prior art compositions using polysiloxane block co-polycarbonate having higher amounts of polysiloxane block content, the advantages the polysiloxane block can provide in the final composition and any resulting molded article may be retained.

Not wishing to be bound by theory, it is believed that the use of a polysiloxane block co-polycarbonate having a polysiloxane block content of 10% by weight or less helps reduce delamination as the polysiloxane block portion of the composition is better dispersed. With polysiloxane block co-polycarbonate having a higher polysiloxane block content, it is believed that the portions of the polysiloxane block are not miscible with the base polycarbonate resin. These immiscible portions are believed to help hinder dispersion of the filler, thereby resulting in a higher amount of the filler on the surface of the molded article. Using a polysiloxane block co-polycarbonate having a lower polysiloxane block content, these immiscible portions are reduced or even eliminated such that the presence of the filler on the surface of the molded article is substantially reduced.

Accordingly, in one aspect, the thermoplastic compositions of the present invention use a polycarbonate resin as the base for the composition. The amount of polycarbonate will vary depending on the requisite performance properties of the end-use materials. For example, the amount of polycarbonate will be balanced with the amount of polysiloxane block co-polycarbonates added to a composition of matter, e.g. to balance the delamination behavior of the electromagnetic shielding agent. In addition, additives/other chemistries must be selected so as not to substantially degrade the polycarbonate material or the other properties of the polycarbonate compositions.

In one embodiment, the polycarbonates can be linear, branched, or a combination thereof. Various types of polycarbonates that have a repeating structural background of the following formula (1):

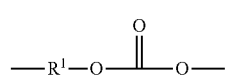

(1)

can be utilized for the claimed invention/inventions encompassed by this disclosure.

In one embodiment, the polycarbonate is derived from bisphenol-A.

In another embodiment, each $R^1$ group is a divalent aromatic group, for example derived from an aromatic dihydroxy compound of the formula (2):

$$HO\text{-}A^1\text{-}Y^1\text{-}A^2\text{-}OH \qquad (2)$$

wherein each of $A^1$ and $A^2$ is a monocyclic divalent arylene group, and $Y^1$ is a single bond or a bridging group having one or two atoms that separate $A^1$ from $A^2$. In an exemplary embodiment, one atom separates $A^1$ from $A^2$.

In another embodiment, when each of $A^1$ and $A^2$ is phenylene, $Y^1$ is para to each of the hydroxyl groups on the phenylenes. Illustrative non-limiting examples of groups of this type are —O—, —S—, —S(O)—, —S(O)$_2$—, —C(O)—, methylene, cyclohexyl-methylene, 2-[2.2.1]-bicycloheptylidene, ethylidene, isopropylidene, neopentylidene, cyclohexylidene, cyclopentadecylidene, cyclododecylidene, and adamantylidene. The bridging group $Y^1$ can be a hydrocarbon group or a saturated hydrocarbon group such as methylene, cyclohexylidene, or isopropylidene.

Included within the scope of formula (2) are bisphenol compounds of general formula (3):

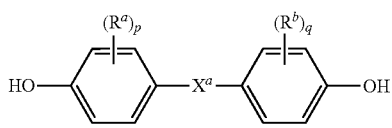

wherein $R^a$ and $R^b$ each represent a halogen atom or a monovalent hydrocarbon group and can be the same or different; p and q are each independently integers of 0 to 4; and $X^a$ represents a single bond or one of the groups of formulas (4) or (5):

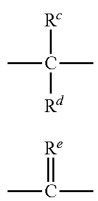

wherein $R^c$ and $R^d$ are each independently hydrogen, $C_{1-12}$ alkyl, $C_{1-12}$ cycloalkyl, $C_{7-12}$ arylalkyl, $C_{1-12}$ heteroalkyl, or cyclic $C_{7-12}$ heteroarylalkyl, and $R^e$ is a divalent $C_{1-12}$ hydrocarbon group. In particular, $R^c$ and $R^d$ are each the same hydrogen or $C_{1-4}$ alkyl group, specifically the same $C_{1-3}$ alkyl group, even more specifically, methyl.

In an embodiment, $R^c$ and $R^d$ taken together represent a $C_{3-20}$ cyclic alkylene group or a heteroatom-containing $C_{3-20}$ cyclic alkylene group comprising carbon atoms and heteroatoms with a valency of two or greater. These groups can be in the form of a single saturated or unsaturated ring, or a fused polycyclic ring system wherein the fused rings are saturated, unsaturated, or aromatic. A specific heteroatom-containing a cyclic alkylene group comprises at least one heteroatom with a valency of 2 or greater, and at least two carbon atoms. Exemplary heteroatoms in the heteroatom-containing cyclic alkylene group include —O—, —S—, and —N(Z)—, where Z is a substituent group selected from hydrogen, hydroxy, $C_{1-12}$ alkyl, $C_{1-12}$ alkoxy, or $C_{1-12}$ acyl.

In a specific exemplary embodiment, $X^a$ is a substituted $C_{3-18}$ cycloalkylidene of the formula (6):

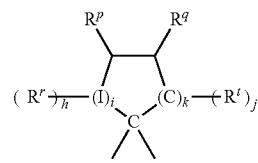

wherein each $R^r$, $R^p$, $R^q$, and $R^t$ is independently hydrogen, halogen, oxygen, or $C_{1-12}$ organic group; I is a direct bond, a carbon, or a divalent oxygen, sulfur, or —N(Z)— wherein Z is hydrogen, halogen, hydroxy, $C_{1-12}$ alkyl, $C_{1-12}$ alkoxy, or $C_{1-12}$ acyl; h is 0 to 2, j is 1 or 2, i is an integer of 0 or 1, and k is an integer of 0 to 3, with the proviso that at least two of $R^r$, $R^p$, $R^q$, and $R^t$ taken together are a fused cycloaliphatic, aromatic, or heteroaromatic ring. It will be understood that where the fused ring is aromatic, the ring as shown in formula (6) will have an unsaturated carbon-carbon linkage where the ring is fused. When k is 1 and i is 0, the ring as shown in formula (6) contains 4 carbon atoms, when k is 2, the ring as shown contains 5 carbon atoms, and when k is 3, the ring contains 6 carbon atoms. In one embodiment, two adjacent groups (e.g., $R^q$ and $R^t$ taken together) form an aromatic group, and in another embodiment, $R^q$ and $R^t$ taken together form one aromatic group and $R^t$ and $R^p$ taken together form a second aromatic group.

When k is 3 and i is 0, bisphenols containing substituted or unsubstituted cyclohexane units are used, for example bisphenols of formula (7):

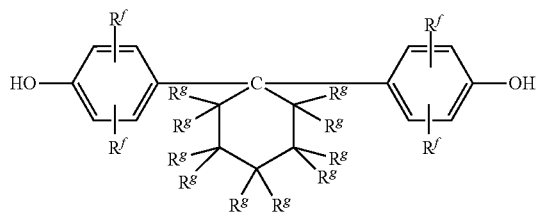

wherein each $R^f$ is independently hydrogen, $C_{1-12}$ alkyl, or halogen; and each $R^g$ is independently hydrogen or $C_{1-12}$ alkyl. The substituents can be aliphatic or aromatic, straight chain, cyclic, bicyclic, branched, saturated, or unsaturated. Such cyclohexane-containing bisphenols, for example the reaction product of two moles of a phenol with one mole of a hydrogenated isophorone, are useful for making polycarbonate polymers with high glass transition temperatures and high heat distortion temperatures. Cyclohexyl bisphenol containing polycarbonates, or a combination comprising at least one of the foregoing with other bisphenol polycarbonates, are supplied by Bayer Co. under the APEC® trade name.

Other useful dihydroxy compounds having the formula HO—$R^1$—OH include aromatic dihydroxy compounds of formula (8):

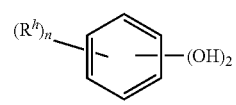

wherein each $R^h$ is independently a halogen atom, a $C_{1-10}$ hydrocarbyl such as a $C_{1-10}$ alkyl group, a halogen substituted $C_{1-10}$ hydrocarbyl such as a halogen-substituted $C_{1-10}$ alkyl group, and n is 0 to 4. The halogen is usually bromine.

Some illustrative examples of dihydroxy compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl) propane, bis(4-hydroxyphenyl)phenylmethane, 2,2-bis(4-hydroxy-3-bromophenyl)propane, 1,1-bis(hydroxyphenyl) cyclopentane, 1,1-bis(4-hydroxyphenyl)cyclohexane, 1,1-bis(4-hydroxyphenyl)isobutene, 1,1-bis(4-hydroxyphenyl) cyclododecane, trans-2,3-bis(4-hydroxyphenyl)-2-butene, 2,2-bis(4-hydroxyphenyl)adamantine, alpha, alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis (4-hydroxyphenyl)ether, bis(4-hydroxyphenyl)ether, bis(4-hydroxyphenyl)sulfide, bis(4-hydroxyphenyl)sulfoxide, bis (4-hydroxyphenyl)sulfone, 9,9 to bis(4-hydroxyphenyl) fluorine, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, resorcinol, substituted resorcinol compounds such as 5-methyl resorcinol, 5-ethyl resorcinol, 5-propyl resorcinol, 5-butyl resorcinol, 5-t-butyl resorcinol, 5-phenyl resorcinol, 5-cumyl resorcinol, 2,4,5,6-tetrafluoro resorcinol, 2,4,5,6-tetrabromo resorcinol, or the like; catechol; hydroquinone; substituted hydroquinones such as 2-methyl hydroquinone, 2-ethyl hydroquinone, 2-propyl hydroquinone, 2-butyl hydroquinone, 2-t-butyl hydroquinone, 2-phenyl hydroquinone, 2-cumyl hydroquinone, 2,3, 5,6-tetramethyl hydroquinone, 2,3,5,6-tetra-t-butyl hydroquinone, 2,3,5,6-tetrafluoro hydroquinone, 2,3,5,6-tetrabromo hydroquinone, and the like, as well as combinations comprising at least one of the foregoing dihydroxy compounds.

Specific examples of bisphenol compounds that can be represented by formula (2) include 1,1-bis(4-hydroxyphenyl)methane, 1,1-bis(4-hydroxyphenyl)ethane, 2,2-bis(4-hydroxyphenyl)propane (hereinafter "bisphenol A" or "BPA"), 2,2-bis(4-hydroxyphenyl)butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxy-t-butylphenyl) propane, 3,3-bis(4-hydroxyphenyl)phthalimidine, 2-phenyl-3,3-bis(4-hydroxyphenyl)phthalimidine (PPPBP), and 1,1-bis(4-hydroxy-3-methylphenyl)cyclohexane (DMBPC). Combinations comprising at least one of the foregoing dihydroxy compounds can also be used.

"Polycarbonate" as used herein includes homopolycarbonates, copolymers comprising different $R^1$ moieties in the carbonate (referred to herein as "copolycarbonates"), and copolymers comprising carbonate units and other types of polymer units, such as ester units.

In one specific embodiment, the polycarbonate is a linear homopolymer or copolymer comprising units derived from bisphenol A, in which each of $A^2$ and $A^2$ is p-phenylene and $Y^1$ is isopropylidene in formula (2). More specifically, at least 60%, particularly at least 80% of the $R^1$ groups in the polycarbonate are derived from bisphenol A.

Another specific type of copolymer is a polyester carbonate, also known as a polyester-polycarbonate. Such copolymers further contain, in addition to recurring carbonate chain units of the formula (1), repeating units of formula (9):

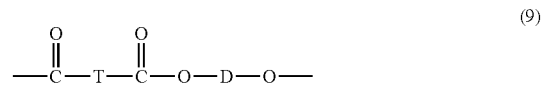

(9)

wherein D is a divalent group derived from a dihydroxy compound, and can be, for example, a $C_{2-10}$ alkylene group, a $C_{6-20}$ alicyclic group, a $C_{6-20}$ aromatic group or a polyoxyalkylene group in which the alkylene groups contain 2 to 6 carbon atoms, specifically 2, 3, or 4 carbon atoms; and T divalent group derived from a dicarboxylic acid, and can be, for example, a $C_{2-10}$ alkylene group, a $C_{6-20}$ alicyclic group, a $C_{6-20}$ alkyl aromatic group, or a $C_{6-20}$ aromatic group.

In one embodiment, D is a $C_{2-30}$ alkylene group having a straight chain, branched chain, or cyclic (including polycyclic) structure. In another embodiment, D is derived from an aromatic dihydroxy compound of formula (3) above. In another embodiment, D is derived from an aromatic dihydroxy compound of formula (8) above.

Examples of aromatic dicarboxylic acids that can be used to prepare the polyester units include isophthalic or terephthalic acid, 1,2-di(p-carboxyphenyl)ethane, 4,4'-dicarboxydiphenyl ether, 4,4'-bisbenzoic acid, and combinations comprising at least one of the foregoing acids. Acids containing fused rings can also be present, such as in 1,4-, 1,5-, or 2,6-naphthalenedicarboxylic acids. Specific dicarboxylic acids are terephthalic acid, isophthalic acid, naphthalene dicarboxylic acid, cyclohexane dicarboxylic acid, or combinations thereof. A specific dicarboxylic acid comprises a combination of isophthalic acid and terephthalic acid wherein the weight ratio of isophthalic acid to terephthalic acid is 91:9 to 2:98. In another specific embodiment, D is a $C_{2-6}$ alkylene group and T is p-phenylene, m-phenylene, naphthalene, a divalent cycloaliphatic group, or a combination thereof. This class of polyester includes the poly(alkylene terephthalates).

The molar ratio of ester units to carbonate units in the copolymers can vary broadly, for example 1:99 to 99:1, specifically 10:90 to 90:10, more specifically 25:75 to 75:25, depending on the desired properties of the final composition.

In a specific embodiment, the polyester unit of a polyester-polycarbonate can be derived from the reaction of a combination of isophthalic and terephthalic diacids (or derivatives thereof) with resorcinol. In another specific embodiment, the polyester unit of a polyester-polycarbonate is derived from the reaction of a combination of isophthalic acid and terephthalic acid with bisphenol-A. In a specific embodiment, the polycarbonate units are derived from bisphenol A. In another specific embodiment, the polycarbonate units are derived from resorcinol and bisphenol A in a molar ratio of resorcinol carbonate units to bisphenol A carbonate units of 1:99 to 99:1.

The selection of a polycarbonate backbone of choice depends on many factors such as end use and other factors understood by one of ordinary skill the art.

In one embodiment, the polycarbonate is derived from at least one or more bisphenols and one of the bisphenols is Bisphenol-A.

In another embodiment, the polycarbonate can be linear, branched or a combination of linear and branched polycarbonates.

The polycarbonates of the claimed invention can contain branched polycarbonate(s). Various types of branching agents can be utilized for the claimed invention/inventions encompassed by this disclosure.

Branched polycarbonate blocks can be prepared by adding a branching agent during polymerization. These branching agents include polyfunctional organic compounds containing at least three functional groups selected from hydroxyl, carboxyl, carboxylic anhydride, haloformyl, and mixtures of the foregoing functional groups. Specific examples include trimellitic acid, trimellitic anhydride, trimellitic trichloride (TMTC), tris-p-hydroxy phenyl ethane (THPE), 3,3-bis-(4-hydroxyphenyl)-oxindole (also known as isatin-bis-phenol), tris-phenol TC (1,3,5-tris((p-hydroxyphenyl)isopropyl)benzene), tris-phenol PA (4(4(1,1-bis(p-hydroxyphenyl)-ethyl)alpha, alpha-dimethyl benzyl)phenol), 4-chloroformyl phthalic anhydride, trimesic acid, and benzophenone tetracarboxylic acid. The branching agents can be added at a level of 0.05 to 2.0 wt. %. Mixtures comprising linear polycarbonates and branched polycarbonates can be used.

In some embodiments, a particular type of branching agent is used to create branched polycarbonate materials. These branched polycarbonate materials have statistically more than two end groups. The branching agent is added in an amount (relative to the bisphenol monomer) that is sufficient to achieve the desired branching content, that is, more than two end groups. The molecular weight of the polymer may become very high upon addition of the branching agent and may lead to viscosity problems during phosgenation. Therefore, in some embodiments, an increase in the amount of the chain termination agent is used in the polymerization. The amount of chain termination agent used when the particular branching agent is used is generally higher than if only a chain termination agent alone is used. The amount of chain termination agent used is generally above 5 mole percent and less than 20 mole percent compared to the bisphenol monomer.

In some embodiments, the branching agent is a structure derived from a triacid trichloride of the formula (10)

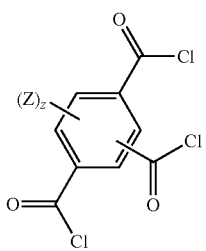

(10)

wherein Z is hydrogen, a halogen, $C_{1-3}$ alkyl group, $C_{1-3}$ alkoxy group, $C_{7-12}$ arylalkyl, alkylaryl, or nitro group, and z is 0 to 3; or a branching agent derived from a reaction with a tri-substituted phenol of the formula (11)

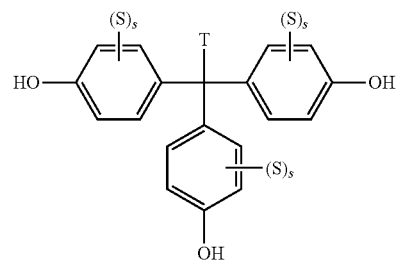

(11)

wherein T is a $C_{1-20}$ alkyl group, $C_{1-20}$ alkyleneoxy group, $C_{7-12}$ arylalkyl, or alkylaryl group, S is hydrogen, a halogen, $C_{1-3}$ alkyl group, $C_{1-3}$ alkoxy group, $C_{7-12}$ arylalkyl, alkylaryl, or nitro group, s is 0 to 4.

In another embodiment, the branching agent is a structure having formula (12)

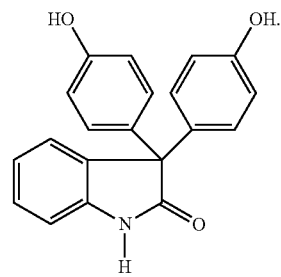

(12)

Examples of specific branching agents that are particularly effective in the compositions include trimellitic trichloride (TMTC), tris-p-hydroxy phenyl ethane (THPE) and isatin-bis-phenol. In one embodiment, in formula (10), Z is hydrogen and z is 3. In another embodiment, in formula (11), S is hydrogen, T is methyl and s is 4.

The relative amount of branching agents used in the manufacture of the polymer will depend on a number of considerations, for example the type of $R^1$ groups, the amount of cyanophenol/end-capping agents, and the desired molecular weight of the polycarbonate. In general, the amount of branching agent is effective to provide about 0.1 to 10 branching units per 100 $R^1$ units, specifically about 0.5 to 8 branching units per 100 $R^1$ units, and more specifically about 0.75 to 5 branching units per 100 $R^1$ units. For branching agents having formula (10), the amount of branching agent tri-ester groups are present in an amount of about 0.1 to 10 branching units per 100 $R^1$ units, specifically about 0.5 to 8 branching units per 100 $R^1$ units, and more specifically about 0.75 to 5 tri-ester units per 100 $R^1$ units. For branching agents having formula (11), the amount of branching agent tricarbonate groups are present in an amount of about 0.1 to 10 branching units per 100 $R^1$ units, specifically about 0.5 to 8 branching units per 100 $R^1$ units, and more specifically about 0.75 to 5 tri-phenylcarbonate units per 100 $R^1$ units. In some embodiments, a combination of two or more branching agents may be used.

In one embodiment, the polycarbonate of the composition has a branching level of at least 0.1%, or at least 0.2%, or at least 0.4%, or at least 1%, or at least 2%, or at least 3%, or from 1% to 3%.

Various types of end-capping agents can be utilized to control the length of the polycarbonate material. End-capping agents may include monofunctional phenols or monofunctional alcohols, $C_1$-$C_{30}$ monochloroformates derived from monofunctional phenols or alcohols, $C_2$-$C_{30}$ monocarboxylic acids, and $C_2$-$C_{30}$ monocarboxylic acid chlorides.

In one embodiment, the end-capping agents are selected from at least one of the following: phenol or a phenol containing one or more substitutions with at least one of the following: aliphatic groups, olefinic groups, aromatic groups, halogens, ester groups, and ether groups.

Of particular usefulness commercially, in another embodiment, the end-capping agents are selected from at least one of the following: phenol, para-t-butylphenol or para-cumylphenol.

In another embodiment, the end-capping agent has a pKa between about 8.3 and about 11. In a further embodiment, the end-capping agent has a pKa of between 9 and 11.

In another embodiment, the polycarbonate is not a polysiloxane block-co-polycarbonate.

In another aspect of the present invention, the thermoplastic compositions of the present invention use a polysiloxane block-co-polycarbonate. Polysiloxane block co-polycarbonate is used to help facilitate low temperature impact strength of the composition of matter, specifically, molded parts derived therefrom.

In one embodiment, a polysiloxane block co-polycarbonate is formed from carbonate units derived from dihydroxy aromatic containing unit(s) and a polysiloxane containing unit(s) having dihydroxy aromatic end groups. Other protocols known to one of ordinary skill in the art can be utilized.

In another embodiment, the dihydroxy aromatic unit is bisphenol-A.

In another embodiment, the polysiloxane units have the following formula (13):

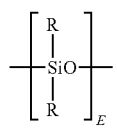

(13)

wherein each occurrence of R is same or different, and is a $C_{1-13}$ monovalent organic group. For example, R may independently be a $C_{1-13}$ alkyl group, $C_{1-13}$ alkoxy group, $C_{2-13}$ alkenyl group, $C_{2-13}$ alkenyloxy group, $C_{3-6}$ cycloalkyl group, $C_{3-6}$ cycloalkoxy group, $C_{6-14}$ aryl group, $C_{6-10}$ aryloxy group, $C_{7-13}$ arylalkyl group, $C_{7-13}$ arylalkoxy group, $C_{7-13}$ alkylaryl group, or $C_{7-13}$ alkylaryloxy group. The foregoing groups may be fully or partially halogenated with fluorine, chlorine, bromine, or iodine, or a combination thereof. Combinations of the foregoing R groups may be used in the same copolymer. In an embodiment, the polysiloxane comprises R groups that have a minimum hydrocarbon content. In a specific embodiment, an R group with a minimum hydrocarbon content is a methyl group.

The value of E in formula (13) may vary widely depending on the type and relative amount of each component in the thermoplastic composition, the desired properties of the composition, and like considerations. Herein, E has an average value of 4 to 100.

In another embodiment, E has an average value of 20 to 100.

In another embodiment, E has an average value of 20 to 75.

In a further embodiment, E has an average value of 35 to 55.

In another embodiment, polysiloxane units are derived from dihydroxy aromatic compound of formula (14):

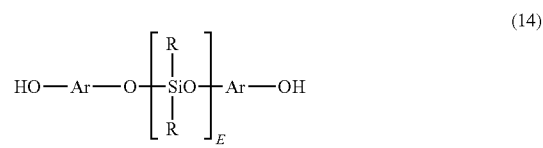

(14)

wherein E is as defined above; each R may independently be the same or different, and is as defined above; and each Ar may independently be the same or different, and is a substituted or unsubstituted $C_{6-30}$ arylene group, wherein the bonds are directly connected to an aromatic moiety. Suitable Ar groups in formula (14) may be derived from a $C_{6-30}$ dihydroxy aromatic compound, for example a dihydroxy aromatic compound of formula (2), (3), (7), or (8) above. Combinations comprising at least one of the foregoing dihydroxy aromatic compounds may also be used. Exemplary dihydroxy aromatic compounds are resorcinol (i.e., 1,3-dihydroxybenzene), 4-methyl-1,3-dihydroxybenzene, 5-methyl-1,3-dihydroxybenzene, 4,6-dimethyl-1,3-dihydroxybenzene, 1,4-dihydroxybenzene, 1,1-bis(4-hydroxyphenyl)methane, 1,1-bis(4-hydroxyphenyl)ethane, 2,2-bis(4-hydroxyphenyl)propane, 2,2-bis(4-hydroxyphenyl)butane, 2,2-bis(4-hydroxyphenyl)octane, 1,1-bis(4-hydroxyphenyl)propane, 1,1-bis(4-hydroxyphenyl)n-butane, 2,2-bis(4-hydroxy-1-methylphenyl)propane, 1,1-bis(4-hydroxyphenyl)cyclohexane, bis(4-hydroxyphenyl sulfide), and 1,1-bis(4-hydroxy-t-butylphenyl)propane. Combinations comprising at least one of the foregoing dihydroxy compounds may also be used. In an embodiment, the dihydroxy aromatic compound is unsubstituted, or is not substituted with non-aromatic hydrocarbon-containing substituents such as, for example, alkyl, alkoxy, or alkylene substituents.

In a specific embodiment, where Ar is derived from resorcinol, the polysiloxane repeating units are derived from dihydroxy aromatic compounds of formula (15):

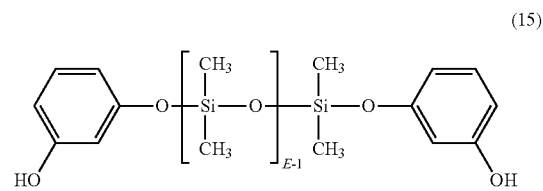

(15)

or, where Ar is derived from bisphenol-A, from dihydroxy aromatic compounds of formula (16):

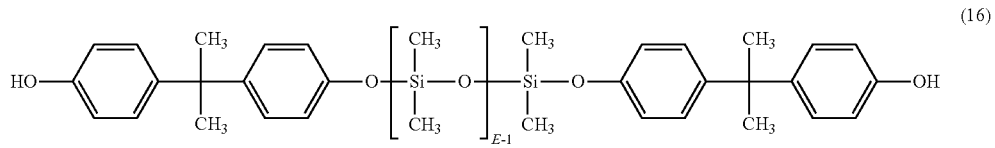

(16)

wherein E is as defined above.

In another embodiment, polysiloxane units are derived from dihydroxy aromatic compound of formula (17):

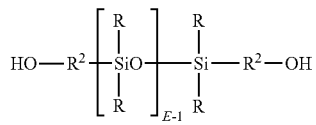

(17)

wherein R and E are as described above, and each occurrence of $R^2$ is independently a divalent $C_{1-30}$ alkylene or $C_{7-30}$ arylene-alkylene, and wherein the polymerized polysiloxane unit is the reaction residue of its corresponding dihydroxy aromatic compound. In a specific embodiment, where $R^2$ is $C_{7-30}$ arylene-alkylene, the polysiloxane units are derived from dihydroxy aromatic compound of formula (18):

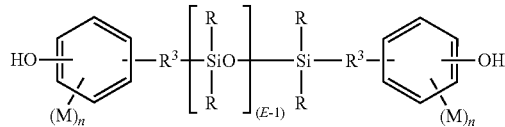

(18)

wherein R and E are as defined above. Each $R^3$ is independently a divalent $C_{2-8}$ aliphatic group. Each M may be the same or different, and may be a halogen, cyano, nitro, $C_{1-8}$ alkylthio, $C_{1-8}$ alkyl, $C_{1-8}$ alkoxy, $C_{2-8}$ alkenyl, $C_{2-8}$ alkenyloxy group, $C_{3-8}$ cycloalkyl, $C_{3-8}$ cycloalkoxy, $C_{6-10}$ aryl, $C_{6-10}$ aryloxy, $C_{7-12}$ arylalkyl, $C_{7-12}$ arylalkoxy, $C_{7-12}$ alkylaryl, or $C_{7-12}$ alkylaryloxy, wherein each n is independently 0, 1, 2, 3, or 4.

In an embodiment, M is bromo or chloro, an alkyl group such as methyl, ethyl, or propyl, an alkoxy group such as methoxy, ethoxy, or propoxy, or an aryl group such as phenyl, chlorophenyl, or tolyl; $R^3$ is a dimethylene, trimethylene or tetramethylene group; and R is a $C_{1-8}$ alkyl, haloalkyl such as trifluoropropyl, cyanoalkyl, or aryl such as phenyl, chlorophenyl or tolyl. In another embodiment, R is methyl, or a combination of methyl and trifluoropropyl, or a combination of methyl and phenyl. In still another embodiment, M is methoxy, n is 0 or 1, $R^3$ is a divalent $C_{1-3}$ aliphatic group, and R is methyl.

In a specific embodiment, the polysiloxane units are derived from a dihydroxy aromatic compound of formula (19):

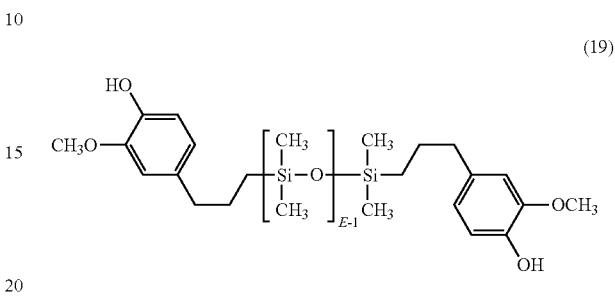

(19)

wherein E is as described above.

In another specific embodiment, the polysiloxane units are derived from dihydroxy aromatic compound of formula (20):

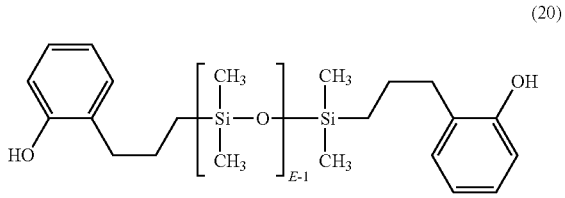

(20)

wherein E is as defined above.

Dihydroxy polysiloxanes typically can be made by functionalizing a substituted siloxane oligomer of formula (21):

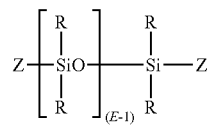

(21)

wherein R and E are as previously defined, and Z is H, halogen (Cl, Br, I), or carboxylate. Exemplary carboxylates include acetate, formate, benzoate, and the like. In an exemplary embodiment, where Z is H, compounds of formula (21) may be prepared by platinum catalyzed addition with an aliphatically unsaturated monohydric phenol. Suitable aliphatically unsaturated monohydric phenols included, for example, eugenol, 2-allylphenol, 4-allylphenol, 4-allyl-2-methylphenol, 4-allyl-2-phenylphenol, 4-allyl-2-bromophenol, 4-allyl-2-t-butoxyphenol, 4-phenyl-2-allylphenol, 2-methyl-4-propenylphenol, 2-allyl-4,6-dimethylphenol, 2-allyl-4-bromo-6-methylphenol, 2-allyl-6-methoxy-4-methylphenol, and 2-allyl-4,6-dimethylphenol. Combinations comprising at least one of the foregoing may also be used. Where Z is halogen or carboxylate, functionalization may be accomplished by reaction with a dihydroxy aromatic compound of formulas (2), (3), (7), (8), or a combination comprising at least one of the foregoing dihydroxy aromatic compounds. In an exemplary embodiment, compounds of formula (11) may be formed from an alpha, omega-bisacetoxypolydiorangonosiloxane and a dihydroxy aromatic compound under phase transfer conditions.

In one embodiment, the polysiloxane block co-polycarbonate is derived from at least Bisphenol-A and polysiloxane bisphenol having the following structure (22),

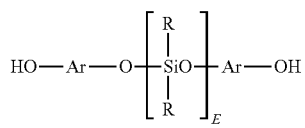
(22)

wherein R comprises a $C_1$-$C_{30}$ aliphatic or an aromatic group or a combination of the aliphatic or the aromatic groups and Ar comprises a $C_6$-$C_{30}$ aromatic group or a combination of aromatic and aliphatic groups and E has an average value of 20 to 100.

In another embodiment, the polysiloxane block co-polycarbonate is derived from at least Bisphenol-A and a polysiloxane bisphenol having the following structure (23),

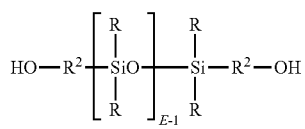
(23)

wherein, R comprises a $C_1$-$C_{30}$ aliphatic or aromatic group or a combination of the aliphatic and the aromatic groups R2 comprises a $C_7$-$C_{30}$ aliphatic or a combination of aliphatic and aromatic groups and E-1 has an average value of 20 to 100.

In another embodiment, the average value of E of structure 1 is 20 to 100 or the average value of E-1 of structure 2 is 20 to 60.

In another embodiment, the average value of E of structure 1 between 30 and 50 or the average value of E-1 of structure 2 is 20 to 50.

In another embodiment, the polysiloxane block co-polycarbonate is derived from at least Bisphenol-A and a polysiloxane bisphenol having the structure of formula (24):

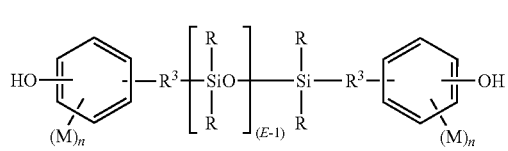
(24)

wherein R and E are as defined above. Each $R^3$ is independently a divalent $C_{2-8}$ aliphatic group. Each M may be the same or different, and may be a halogen, cyano, nitro, $C_{1-8}$ alkylthio, $C_{1-8}$ alkyl, $C_{1-8}$ alkoxy, $C_{2-8}$ alkenyl, $C_{2-8}$ alkenyloxy group, $C_{3-8}$ cycloalkyl, $C_{3-8}$ cycloalkoxy, $C_{6-10}$ aryl, $C_{6-10}$ aryloxy, $C_{7-12}$ arylalkyl, $C_{7-12}$ arylalkoxy, $C_{7-12}$ alkylaryl, or $C_{7-12}$ alkylaryloxy, wherein each n is independently 0, 1, 2, 3, or 4, wherein E has an average value of 20 to 100.

As discussed, it was unexpectedly found that higher amounts of the polysiloxane block in the polysiloxane block co-polycarbonate interfered with the delamination behavior of a molded article formed from the composition. As such, for the compositions of the present invention, the amount of polysiloxane block in the polysiloxane block co-polycarbonate is, in one embodiment, 10% by weight or less. In another embodiment, the amount of polysiloxane block in the polysiloxane block co-polycarbonate is 8% by weight or less. In still another embodiment, the amount of polysiloxane block in the polysiloxane block co-polycarbonate is 6% by weight or less.

While lower levels of polysiloxane block in the polysiloxane block co-polycarbonate are beneficially used, it was discovered that the amount of polysiloxane block in the total composition did not show a noticeable effect on delamination behavior of molded articles. As such, it was found that higher amounts of the polysiloxane block co-polycarbonate could be utilized such that the total amount of the polysiloxane block relative to the total composition could be in the same range as compositions using polysiloxane block co-polycarbonates having higher amounts of polysiloxane block while still providing improved delamination behavior that the compositions using polysiloxane block co-polycarbonates having higher amounts of polysiloxane block could not achieve. In summary, it was not the amount of polysiloxane block in the total composition, it was the amount of polysiloxane block in the polysiloxane block co-polycarbonate. As such, by using higher amounts of the polysiloxane block co-polycarbonates having lower amounts of polysiloxane block, the advantages imparted by the polysiloxane block to the final compositions could be retained while still unexpectedly improving delamination behavior.

Polysiloxane block co-polycarbonates having a lower polysiloxane block content are also those that can be used in transparent applications. For example, these polysiloxane block co-polycarbonates can have a transparency of greater than 90%, as measured using 3.2 millimeter (mm) thick plaques according to ASTM-D1003-00. The polysiloxane block co-polycarbonates compositions can have a haze of less than 10% as measured using 3.2 mm thick plaques according to ASTM-D1003-00.

Accordingly, the amount of polycarbonate will vary depending on the required performance properties of the end use materials, e.g. the amount of other chemistries in the final formulation that a part is molded therefrom. In one embodiment, the composition contains from 1 to 30% by weight of the polycarbonate base resin, based upon a total weight of the composition. In another embodiment, the composition contains from 5 to 25% by weight of the polycarbonate base resin, based upon a total weight of the composition. In another embodiment, the composition contains from 10 to 20% by weight of the polycarbonate base resin, based upon a total weight of the composition.

The amount of polysiloxane block co-polycarbonate can vary in the compositions of the present invention with the restriction of meeting selected end-use performance characteristics of a particular composition of matter or molded part derived therefrom, namely the delamination behavior of the composition when molded into a part. Accordingly, in one embodiment, the composition contains from 30 to 90% by weight of the polysiloxane block co-polycarbonate, based upon a total weight of the composition. In another embodiment, the composition contains from 50 to 85% by weight of the polysiloxane block co-polycarbonate, based upon a total weight of the composition. In another embodiment, the composition contains from 65 to 80% by weight of the polysiloxane block co-polycarbonate, based upon a total weight of the composition.

The amount of polysiloxane block in the final composition can vary in the compositions of the present invention with the restriction of meeting selected end-use performance characteristics of a particular composition of matter or molded part derived therefrom. In one embodiment, the composition contains from 1 to 8% by weight of the polysiloxane block, based upon a total weight of the composition. In another embodiment, the composition contains from 2 to 7% by weight of the polysiloxane block, based upon a total weight of the composition. In yet another embodiment, the composition contains from 3 to 6% by weight of the polysiloxane block, based upon a total weight of the composition.

In addition to the polycarbonate and the polysiloxane block co-polycarbonate, the compositions of the present invention also include an electromagnetic shielding agent. The "electromagnetic shielding agent" as used in the present composition includes a metal fiber, a metal-coated fiber, and/or a metal-coated fiber in combination with a metal fiber.

The metal fiber used in the electromagnetic shielding agent may be any conductive metal fiber. Suitable metals include iron, copper, aluminum, nickel, titanium, and alloys of the foregoing metals. Combinations of the foregoing metals are also contemplated. In one embodiment, the electromagnetic shielding agent is stainless steel fiber. Stainless steel fibers include those comprising alloys of iron with chromium, nickel, carbon, manganese, molybdenum, mixtures comprising at least one of the foregoing, and the like. Suitable stainless steel compositions may also be designated according to commonly used grades such as stainless steel 316, stainless steel 347, and the like. All of the above materials are commercially available. For example, stainless steel fibers are commercially available from Bekaert under the tradename BEKI-SHIELD®.

The length of the metal fiber may be, in one embodiment, from 1 to about 30 millimeters prior to molding. The length of the metal fiber may be, in another embodiment, at least 3 millimeters prior to molding. The length of the metal fiber may be, in yet another embodiment, at least 5 millimeters prior to molding. The length of the metal fiber may be, in still another embodiment, at least 10 millimeters prior to molding. The length of the metal fiber may be, in yet another embodiment, up to 20 millimeters prior to molding. The length of the metal fiber may be, in still another embodiment, up to 15 millimeters prior to molding. After molding, the length of the metal fiber may be less than specified above. For example, in one embodiment, the length of the metal fiber after molding may be 30 micrometers to 3 millimeters.

The diameter of the metal fiber may be, in one embodiment, from 4 to 20 micrometers, both before and after molding. The diameter of the metal fiber may be, in another embodiment, at least 8 micrometers. The diameter of the metal fiber may be, in yet another embodiment, up to 15 micrometers. The diameter of the metal fiber may be, in still another embodiment, up to 12 micrometers. The diameter of the metal fiber may be, in yet another embodiment, up to 10 micrometers.

In alternative embodiments, the electromagnetic shielding agent includes a metal-coated fiber. Suitable core materials for the metal-coated fiber may include vitreous mineral such as glass, silicates of aluminum, silicates of magnesium, silicates of calcium, and the like; and inorganic carbon materials such as graphite, carbon powders, carbon fibers, mica, and the like. Any metals capable of enhancing the shield effectiveness of thermoplastic resins may be used as the metal coating of the metal-coated fiber. Suitable metals include silver, gold, copper, aluminum, nickel, platinum, alloys including at least one of the foregoing metals, combinations including at least one of the foregoing metals, and the like. In one embodiment, the metal-coated fiber is a silver-coated vitreous mineral fiber.

The metal content of the metal-coated fiber may be from 1 to 30 weight percent, based on the total weight of the metal-coated fiber. In an alternative embodiment, the metal-coated fiber may use at least 10 weight percent of the metal. In another embodiment, the metal-coated fiber may use up to 20 weight percent of the metal. In yet another embodiment, the metal-coated fiber may use up to 15 weight percent of the metal.

The length of the metal-coated fiber before and after extrusion and/or molding of the composition may be, in one embodiment, from 25 to 600 micrometers. The length of the metal-coated fiber before and after extrusion and/or molding of the composition may be, in another embodiment, at least 50 micrometers. The length of the metal-coated fiber before and after extrusion and/or molding of the composition may be, in yet another embodiment, at least 150 micrometers. The length of the metal-coated fiber before and after extrusion and/or molding of the composition may be, in still another embodiment, up to 500 micrometers. The length of the metal-coated fiber before and after extrusion and/or molding of the composition may be, in yet another embodiment, up to 400 micrometers. The length of the metal-coated fiber before and after extrusion and/or molding of the composition may be, in still another embodiment, up to 300 micrometers.

The diameter of the metal-coated fiber may be, in one embodiment, from 1 to about 10 micrometers. The diameter of the metal-coated fiber may be, in another embodiment, at least 3 micrometers. The diameter of the metal-coated fiber may be, in yet another embodiment, at least 5 micrometers. The diameter of the metal-coated fiber may be, in still another embodiment, up to 8 micrometers. The diameter of the metal-coated fiber may be, in yet another embodiment, up to 6 micrometers.

The electromagnetic shielding agent may be, in one embodiment, present in the composition from 1 to 30 weight percent, based on the total weight of the composition. The electromagnetic shielding agent may be, in another embodiment, present in the composition in an amount of at least 3 weight percent, based on the total weight of the composition. The electromagnetic shielding agent may be, in yet another embodiment, present in the composition in an amount of up to 20 weight percent, based on the total weight of the composition. The electromagnetic shielding agent may be, in still another embodiment, present in the composition in an amount of up to 15 weight percent, based on the total weight of the composition.

In one embodiment, the compositions herein may contain an electromagnetic shielding agent that is substantially free of a metal powder and a metal flake. The term "substantially free" is herein defined, in one embodiment, as limiting the amount of the powder or flake to less than about 0.1 weight percent, based on the total weight of the composition. In another embodiment, the powder or flake is present at less than about 0.01 weight percent. In yet another embodiment, the powder or flake is not intentionally added to the composition in any amount.

In another embodiment, the composition contains an electromagnetic shielding agent including from 0.5 to 10 weight percent of metal powder and/or metal flake, based on the total weight of the composition. Suitable metal powders and flakes may include iron, silver, aluminum, nickel, copper, alloys comprising at least one of the foregoing metals, mixtures including at least one of the foregoing metals, and the like. Fibers, powders, and flakes may be distinguished from each other on the basis of their aspect ratios. Fibers may be defined has having a number average aspect ratio greater than 4, where the aspect ratio is defined as the ratio of the length to the equivalent circular diameter. In contrast, flakes may be defined as having a number average aspect ratio less than 0.25, and powders may be defined as having a number average aspect ratio of 0.25 to 4.

In addition to the polycarbonate, the polysiloxane block co-polycarbonate, and the electromagnetic shielding agent, the compositions of the present invention optionally include a pigment.

Examples of pigments that may be used in the present invention include, but are not limited to, TiO2 including anatase and rutile, ZnO, BaSO4, CaCO3, BaTiO3 or a combination including at least one of the foregoing pigments. In one embodiment, the pigment is present in amounts of from 0.5 to 10 wt. %. In another embodiment, the pigment is present in amounts from 1 to 8 wt. %. In still another embodiment, the pigment is present in amounts from 2 to 6 wt. %. The amount of pigment added is selected, in part, not to interfere with the EMI shielding characteristics and/or the delamination behavior of a molded article contain the composition.

In addition to the polycarbonate, the polysiloxane block co-polycarbonate, the electromagnetic shielding agent, and any optional pigment, the thermoplastic compositions of the present invention may include various additives ordinarily incorporated in resin compositions of this type. Mixtures of additives may be used. Such additives may be mixed at a suitable time during the mixing of the components for forming the composition. The one or more additives are included in the thermoplastic compositions to impart one or more selected characteristics to the thermoplastic compositions and any molded article made therefrom without materially affecting the EMI shielding characteristics and/or the delamination behavior of a molded article contain the composition. Examples of additives that may be included in the present invention include, but are not limited to, heat stabilizers, process stabilizers, antioxidants, light stabilizers, plasticizers, antistatic agents, mold releasing agents, UV absorbers, lubricants, flow promoters, impact modifiers or a combination of one or more of the foregoing additives.

Suitable heat stabilizers include, for example, organo phosphites such as triphenyl phosphite, tris-(2,6-dimethylphenyl)phosphite, tris-(mixed mono- and di-nonylphenyl) phosphite or the like; phosphonates such as dimethylbenzene phosphonate or the like, phosphates such as trimethyl phosphate, or the like, or combinations including at least one of the foregoing heat stabilizers. Heat stabilizers are generally used in amounts of from 0.01 to 0.5 parts by weight based on 100 parts by weight of the total composition, excluding any filler.

Suitable antioxidants include, for example, organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis [methylene(3,5-di-tert-butyl-4-hydroxyhydrocinnamate)] methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations including at least one of the foregoing antioxidants. Antioxidants are generally used in amounts of from 0.01 to 0.5 parts by weight, based on 100 parts by weight of the total composition, excluding any filler.

Suitable light stabilizers include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers are generally used in amounts of from 0.1 to 1.0 parts by weight, based on 100 parts by weight of the total composition, excluding any filler.

Suitable plasticizers include, for example, phthalic acid esters such as dioctyl-4,5-epoxy-hexahydrophthalate, tris-(octoxycarbonylethyl)isocyanurate, tristearin, epoxidized soybean oil or the like, or combinations including at least one of the foregoing plasticizers. Plasticizers are generally used in amounts of from 0.5 to 3.0 parts by weight, based on 100 parts by weight of the total composition, excluding any filler.

Suitable antistatic agents include, for example, glycerol monostearate, sodium stearyl sulfonate, sodium dodecylbenzenesulfonate or the like, or combinations of the foregoing antistatic agents. In one embodiment, carbon fibers, carbon nanofibers, carbon nanotubes, carbon black, or any combination of the foregoing may be used in a polymeric resin containing chemical antistatic agents to render the composition electrostatically dissipative.

Suitable mold releasing agents include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from 0.1 to 1.0 parts by weight, based on 100 parts by weight of the total composition, excluding any filler.

Suitable UV absorbers include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylacryloyl)oxy]-2,2-bis[[(2-cyano-3,3-diphenylacryloyl)oxy] methyl]propane (UVINUL™ 3030); 2,2'-(1,4-phenylene) bis(4H-3,1-benzoxazin-4-one); 1,3-bis[(2-cyano-3,3-diphenylacryloyl)oxy]-2,2-bis[[(2-cyano-3,3-diphenylacryloyl) oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight based on 100 parts by weight of the total composition, excluding any filler.

Suitable lubricants include for example, fatty acid esters such as alkyl stearyl esters, e.g., methyl stearate or the like;

mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants are generally used in amounts of from 0.1 to 5 parts by weight, based on 100 parts by weight of the total composition, excluding any filler.

Suitable blowing agents include for example, low boiling halohydrocarbons and those that generate carbon dioxide; blowing agents that are solid at room temperature and when heated to temperatures higher than their decomposition temperature, generate gases such as nitrogen, carbon dioxide, ammonia gas, such as azodicarbonamide, metal salts of azodicarbonamide, 4,4' oxybis(benzenesulfonylhydrazide), sodium bicarbonate, ammonium carbonate, or the like, or combinations including at least one of the foregoing blowing agents. Blowing agents are generally used in amounts of from 1 to 20 parts by weight, based on 100 parts by weight of the total composition, excluding any filler.

Additionally, materials to improve flow and other properties may be added to the composition, such as low molecular weight hydrocarbon resins. Particularly useful classes of low molecular weight hydrocarbon resins are those derived from petroleum $C_5$ to $C_9$ feedstock that are derived from unsaturated $C_5$ to $C_9$ monomers obtained from petroleum cracking. Non-limiting examples include olefins, e.g. pentenes, hexenes, heptenes and the like; diolefins, e.g. pentadienes, hexadienes and the like; cyclic olefins and diolefins, e.g. cyclopentene, cyclopentadiene, cyclohexene, cyclohexadiene, methyl cyclopentadiene and the like; cyclic diolefin dienes, e.g., dicyclopentadiene, methylcyclopentadiene dimer and the like; and aromatic hydrocarbons, e.g. vinyltoluenes, indenes, methylindenes and the like. The resins can additionally be partially or fully hydrogenated.

There is no particular limitation on the method by which the compositions of the present invention may be prepared. For example, the ingredients may be placed into an extrusion compounder with the thermoplastic resin to produce molding pellets. Alternatively, the ingredients may be mixed with a thermoplastic resin by dry blending, then either fluxed on a mill and comminuted, or extruded and chopped. Further, the ingredients may also be mixed with powder or granular thermoplastic resin and directly molded, e.g., by injection or transferred molding techniques.

In another embodiment, the thermoplastic compositions may be prepared by first forming a concentrate of the electromagnetic shielding agent in the base thermoplastic resin or any compatible thermoplastic resin (i.e., one which will not cause delamination in the blended composition). The concentrate may be extruded and cut up into molding compounds such as conventional granules, pellets, and the like by standard techniques. Thereafter the concentrate may be incorporated with other ingredients by any of the foregoing methods or other blending methods known in the art.

The compositions described herein may have, in one embodiment, a shielding effectiveness of at least 10 decibels measured according to the American Society for Testing and Materials' (ASTM) standard test method for measuring the electromagnetic shielding effectiveness of planar materials (D4935). In another embodiment, the compositions have a shielding effectiveness of at least 20 decibels. In yet another embodiment, the compositions have a shielding effectiveness of at least 40 decibels. In still another embodiment, the compositions have a shielding effectiveness of at least 50 decibels. In yet another embodiment, the compositions have a shielding effectiveness of at least 60 decibels.

The present compositions may be molded into pellets. The compositions may be molded, foamed, or extruded by known methods into various structures or articles, especially those benefiting from EMI shielding, such as electronic equipment, electronic housings, or electronic components. Non-limiting examples include computer housings, cell phone components, hand held electronic devices such as pagers, camera housings, video games, calculators, wireless car entry devices, automotive parts, filter housings, luggage carts, and office chairs.

The present invention is further illustrated by the following non-limiting examples.

EXAMPLES

All materials used can be found in the tables below. Weight-averaged molecular weight values reported in the Tables below were obtained by gel permeation chromatography (GPC), using a crosslinked styrene-divinylbenzene column and calibrated to polycarbonate references. GPC samples are prepared at a concentration of about 1 mg/ml (milligram per milliliter), and are eluted at a flow rate of about 1.5 ml/min (milliliter per minute) using methylene chloride as the solvent.

Table 1 below provides a general description of the materials used in this application.

TABLE 1

| Abbreviation | Component | Source |
| --- | --- | --- |
| PC | BPA polycarbonate | SABIC-IP |
| PC-Si 1 | Polysiloxane block co-polycarbonate (20% siloxane, Mw = 30,000*) | SABIC-IP |
| PC-Si 2 | Polysiloxane block co-polycarbonate (6 wt % siloxane, Mw = 30,000) | SABIC-IP |
| SSF | Stainless Steel Fiber | Huitong |
| Pigment | Pigment | Hubron International |
| Additive | Stabilizer | CIBA |
| Additive | PTFE | SABIC-IP |
| Additive | Mold Release | FACI |
| Additive | Flame Retardant (KSS) | SEAL SANDS CHEMICALS LTD |

*Molecular weights in g/mol, measured by GPC according to a PC standard.

Table 2 provides the formulation for a prior art composition (Comp. Ex. 2) and a composition made according to the concepts of the present invention (Sample 1). The compositions were made using a two-step process. In the first step, the PC components, flame retardant and other pigments and additives were compounded in a twin-screw extruder. The resulting compound was then separately compounded with the stainless steel fiber in a second step using a single-screw extruder to form pellets.

Molded articles to be tested were made from the pellets. 150 mm square plates were formed for EMI and surface testing using a Toshiba EC180SX injection machine. Plaques were molded that were 150 mm×150 mm×2 mm in dimension. The plaques were tested for EMI properties using EMI shielding test ASTM D4935 using a network analyser ZVL3 (Rhode & Schwarz Co.). The plaques were also tested for surface observation using Scanning Electron Microscope (S-3000N from Hitachi High Tech Co.).

TABLE 2

|  | Comparative Example 2 (Comp. Ex. 2) | Sample 1 |
|---|---|---|
| PC (% of total composition) | 67 | 13 |
| PC-Si 1 (% of total composition) | 20 | 0 |
| PC-Si 2 (% of total composition) | 0 | 74 |
| SSF (% of total composition) | 10 | 10 |
| Pigment(% of total composition) | 2 | 2 |
| Stabilizer (% of total composition) | 0.1 | 0.1 |
| PTFE (% of total composition) | 0.3 | 0.3 |
| Mold Release (% of total composition) | 0.3 | 0.3 |
| Flame Retardant (KSS) (% of total composition) | 0.3 | 0.3 |
| Siloxane (% of total composition) | 3.9 | 4.4 |

As may be seen in FIG. 1, when molded at different mold temperatures (100° C. and 120° C.), the molded articles made using the prior art composition showed stainless steel fibers on the surface of molded article. However, molded articles made using the composition made according to the inventive concepts of the present invention were substantially free of stainless steel fibers on the surface. As a result, the compositions made according to the present invention provided better delamination behavior than the prior art compositions despite having approximately the same siloxane content.

Table 3 provides the formulations for several comparative prior art compositions (Comp. Ex. 1-4) and a composition made according to the concepts of the present invention (Sample 2). Table 4 compares the physical performance of the compositions as it related to the ability of a molded article made from the composition to be painted after being molded at a given mold temperature, and as compared to delamination testing wherein 5 samples were subjected to delamination testing and the number of samples that failed were noted.

TABLE 3

|  | Comp. Ex. 1 | Comp. Ex. 2 | Comp. Ex. 3 | Comp. Ex. 4 | Sample 2 |
|---|---|---|---|---|---|
| PC (% of total composition) | 62 | 67 | 72 | 74 | 23 |
| PC-Si 1 (% of total composition) | 25 | 20 | 15 | 13 |  |
| PC-Si 2 (% of total composition) |  |  |  |  | 64 |
| SSF (% of total composition) | 10 | 10 | 10 | 10 | 10 |
| Pigment (% of total composition) | 2 | 2 | 2 | 2 | 2 |
| Stabilizer (% of total composition) | 0.1 | 0.1 | 0.1 | 0.1 | 0.1 |
| PTFE (% of total composition) | 0.3 | 0.3 | 0.3 | 0.3 | 0.3 |
| Mold Release (% of total composition) | 0.3 | 0.3 | 0.3 | 0.3 | 0.3 |
| Flame Retardant (KSS) (% of total composition) | 0.3 | 0.3 | 0.3 | 0.3 | 0.3 |
| Siloxane (% of total composition) | 5 | 3.9 | 3 | 2.6 | 3.8 |

TABLE 4

| Mold Temp | Comp. Ex. 1 | Comp. Ex. 2 | Comp. Ex. 3 | Comp. Ex. 4 | Sample 2 |
|---|---|---|---|---|---|
| 120 C. | Not good | Not good | Good | Good | Good |
| 110 C. | Not good | Not good | Good | Good | Good |
| 100 C. | Not good | Not good | Not good | Not good | Good |
| 90 C. Delamination (defect number) | Not good 5/5 | 5/5 | Not good 5/5 | Not good 3/5 | Good 0/5 |

As may be seen, the composition made according to the concepts of the present invention offered good paintability while also having no defects in five samples tested. Conversely, for samples made using polysiloxane block co-polycarbonate having higher amounts of polysiloxane block content, as the amount of polysiloxane block co-polycarbonate having higher amounts of polysiloxane block content is used, the paintability of the molded article decreased while the number of delamination defects increased—all despite the fact that the amount of polysiloxane block content was approximately the same.

While typical embodiments have been set forth for the purpose of illustration, the foregoing descriptions should not be deemed to be a limitation on the scope of the invention. Accordingly, various modifications, adaptations, and alternatives may occur to one skilled in the art without departing from the spirit and scope of the present invention.

What is claimed is:

1. A thermoplastic composition, comprising:
   a) from 1 to 30% by weight of polycarbonate;
   b) from 30 to 90% by weight of a polysiloxane block co-polycarbonate wherein the polysiloxane block co-polycarbonate has a polysiloxane block content of 10% by weight or less;
   c) from 1 to 30% by weight of an electromagnetic shielding agent, wherein the electromagnetic shielding agent comprises a metal fiber, a metal-coated fiber, or a combination thereof; and
   d) from 0 to 20% by weight of at least one additive selected from a pigment, a processing additive or a combination including at least one of the foregoing additives;
   wherein the composition after molding has a shielding effectiveness of at least about 10 decibels measured according to ASTM D4935;
   further wherein the composition after molding and being painted or coated has a decreased number of delamination defects as compared to a reference thermoplastic composition having an equivalent amount of polysiloxane block content but which comprises a polysiloxane block co-polycarbonate having a higher polysiloxane block content.

2. The thermoplastic composition of claim 1, wherein the polysiloxane block co-polycarbonate has a polysiloxane block content of less than 10% by weight.

3. The thermoplastic composition of claim 1, wherein the polysiloxane block co-polycarbonate has a polysiloxane block content of 8% by weight or less.

4. The thermoplastic composition of claim 1, wherein the polysiloxane block co-polycarbonate has a polysiloxane block content of 6% by weight or less.

5. The thermoplastic composition of claim 1, wherein the polysiloxane block co-polycarbonate has a haze of less than 10% as measured using 3.2 mm thick plaques according to ASTM-D1003-00.

6. The thermoplastic composition of claim 1, wherein the electromagnetic shielding agent comprises stainless steel fibers.

7. The thermoplastic composition of claim 1, wherein the composition comprises from 1 to 10% by weight of at least one additive selected from a pigment, a processing additive or a combination including at least one of the foregoing additives.

8. A thermoplastic composition, comprising:
a) from 5 to 20% by weight of polycarbonate;
b) from 50 to 85% by weight of a polysiloxane block co-polycarbonate wherein the polysiloxane block co-polycarbonate has a polysiloxane block content of 8% by weight or less;
c) from 5 to 20% by weight of an electromagnetic shielding agent, wherein the electromagnetic shielding agent comprises a metal fiber, a metal-coated fiber, or a combination thereof; and
d) from 1 to 10% by weight of at least one additive selected from a pigment, a processing additive or a combination including at least one of the foregoing additives;
wherein the composition after molding has a shielding effectiveness of at least about 10 decibels measured according to ASTM D4935;
further wherein the composition after molding and being painted or coated has a decreased number of delamination defects as compared to a reference thermoplastic composition having an equivalent amount of polysiloxane block content but which comprises a polysiloxane block co-polycarbonate having a higher polysiloxane block content.

9. A thermoplastic composition, comprising:
a) from 10 to 25% by weight of polycarbonate;
b) from 60 to 75% by weight of a polysiloxane block co-polycarbonate wherein the polysiloxane block co-polycarbonate has a polysiloxane block content of 6% by weight or less;
c) from 5 to 15% by weight of an electromagnetic shielding agent, wherein the electromagnetic shielding agent comprises a metal fiber, a metal-coated fiber, or a combination thereof; and
d) from 1 to 10% by weight of at least one additive selected from a pigment, a processing additive or a combination including at least one of the foregoing additives;
wherein the composition after molding has a shielding effectiveness of at least about 10 decibels measured according to ASTM D4935;
further wherein the composition after molding and being painted or coated has a decreased number of delamination defects as compared to a reference thermoplastic composition having an equivalent amount of polysiloxane block content but which comprises a polysiloxane block co-polycarbonate having a higher polysiloxane block content.

10. An article of manufacture comprising the composition of claim 1.

11. The article of manufacture of claim 10, wherein the article is selected from a computer housing, a cell phone, a pager, a camera housing, a video game, a calculator, a wireless car entry device, an automotive part, a filter housing, a luggage cart, and an office chair.

12. The article of manufacture of claim 10, wherein the article is a camera housing.

13. A method of reducing an amount of delamination of a molded article having a coating layer comprising the step of molding an article containing the composition of claim 1; and applying a coating layer to the molded article.

14. The method of claim 13, wherein the coating layer comprises paint.

15. An article of manufacture comprising a molded article comprising:
a) from 10 to 25% by weight of polycarbonate;
b) from 60 to 75% by weight of a polysiloxane block co-polycarbonate wherein the polysiloxane block co-polycarbonate has a polysiloxane block content of 6% by weight or less;
c) from 5 to 15% by weight of an electromagnetic shielding agent; and
d) from 0.11 to 10% by weight of at least one additive selected from a pigment, a processing additive or a combination including at least one of the foregoing additives;
wherein the molded article further comprises a single coating layer and wherein the molded article has an EMI shielding effectiveness of at least 10 decibels measured according to ASTM D4935.

16. The article of manufacture of claim 15, wherein the article is selected from a computer housing, a cell phone, a pager, a camera housing, a video game, a calculator, a wireless car entry device, an automotive part, a filter housing, a luggage cart, and an office chair.

17. The article of manufacture of claim 15, wherein the article is a camera housing.

18. The article of manufacture of claim 15, wherein the coating layer comprises paint.

19. A method of reducing an amount of delamination of a molded article having a coating layer comprising the step of molding an article containing the composition of claim 9; and applying a coating layer to the molded article.

20. The method of claim 19, wherein the coating layer comprises paint.

* * * * *